United States Patent [19]

King et al.

[11] Patent Number: 5,707,744
[45] Date of Patent: Jan. 13, 1998

[54] SOLID PHASE EPITAXIAL CRYSTALLIZATION OF AMORPHOUS SILICON FILMS ON INSULATING SUBSTRATES

[75] Inventors: Tsu-Jae King, Cupertino; Jackson H. Ho, Palo Alto, both of Calif.

[73] Assignee: Xerox Corporation, Stamford, Conn.

[21] Appl. No.: 578,810

[22] Filed: Dec. 26, 1995

[51] Int. Cl.$^6$ .................................... B32B 17/06
[52] U.S. Cl. .................... 428/426; 428/428; 428/446; 428/448; 428/700; 428/701; 428/702
[58] Field of Search .................... 428/428, 446, 428/448, 700, 701, 702, 426

[56] References Cited

U.S. PATENT DOCUMENTS 4,795,679  1/1989  Ramech ........................ 428/446
5,108,843  4/1992  Ohtaka ........................ 428/446
5,186,785  2/1993  Annamalai .................... 428/446

Primary Examiner—Timothy Speer
Attorney, Agent, or Firm—Nola Mae McBain

[57] ABSTRACT

A new polycrystalline silicon film which has been crystallized using a polycrystalline silicon-germanium (poly-$Si_{1-x}Ge_x$) capping film to "seed" crystallization of an amorphous silicon film on an upper surface of a substrate. The polycrystalline silicon film has no nucleation sites and a greater number of grain boundaries in the region near the polycrystalline silicon upper surface than in the region near the polycrystalline silicon and substrate upper surface interface. This indicates that crystallization and crystal growth occurred from the polycrystalline silicon upper surface and proceeded in a direction towards the substrate upper surface.

5 Claims, 2 Drawing Sheets

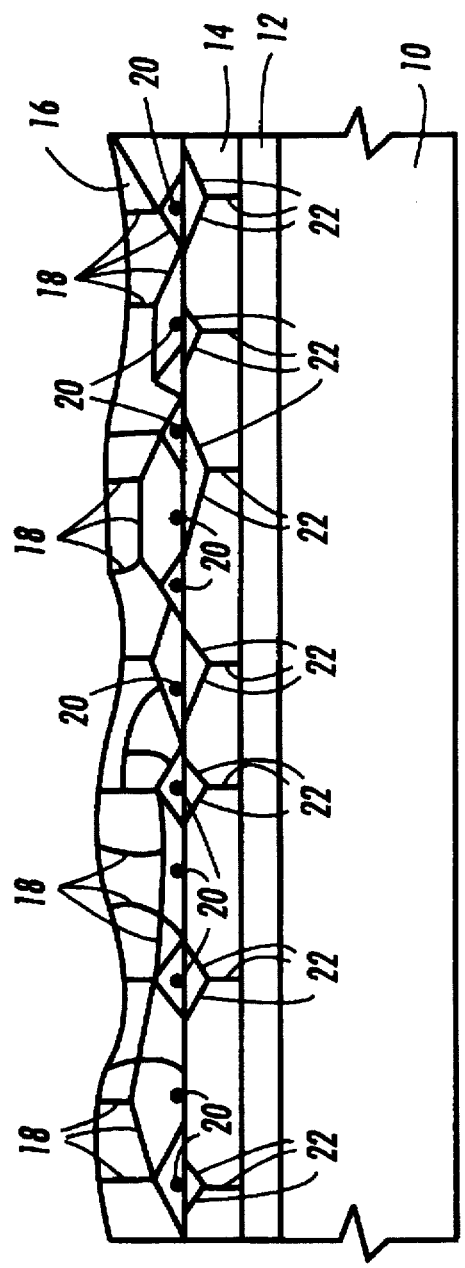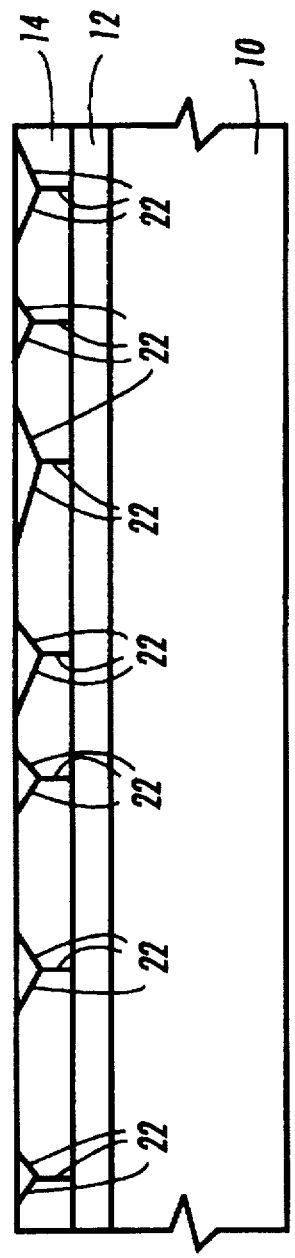
FIG. 3
FIG. 4

SOLID PHASE EPITAXIAL CRYSTALLIZATION OF AMORPHOUS SILICON FILMS ON INSULATING SUBSTRATES

This application is related to copending application titled Solid-Phase Epitaxial Crystallization of Amorphous Silicon Films on Insulating Substrates filed concurrently herewith, and Ser. No. 08/578,809.

BACKGROUND

This invention relates generally to thin film transistors and more particularly concerns a process in which high quality polysilicon films are produced at reduced temperatures compared to traditional methods of producing polysilicon films.

Polycrystalline silicon (polysilicon) thin-film transistors (TFTs) are important for a variety of large-area electronics applications due to their superior performance compared to amorphous silicon ($\alpha$-Si) TFTs. Presently, the preferred method for obtaining high-quality polysilicon films with low surface roughness and high structural perfection on insulating substrates (e.g., oxide, quartz, glass) is by amorphous-phase deposition and subsequent thermal annealing. The crystallization process typically requires either annealing at temperatures ranging from 550° C. to 600° C. for periods of time greater than 2 hours or rapid (less than 1 second) thermal annealing at much higher temperatures of approximately 800° C. This relatively large "thermal budget" required for crystallization is incompatible with large-area glass substrates, which cannot withstand prolonged exposure to temperatures much higher than 600° C. due to warpage and shrinkage problems.

The crystallization of an $\alpha$-Si film on an insulating substrate is limited by two processes. These two limiting processes are grain nucleation and grain growth. Nucleates must form before grain growth can take place. Nucleates will form primarily at the lower interface between the $\alpha$-Si and the substrate. Once the nucleates have been formed, grain growth proceeds from the nucleating sites, both in the lateral direction (parallel to the interface) and the vertical direction (perpendicular to the interface). Since polysilicon films suitable for high performance TFT applications are typically less than 100 nm thick, with average grain sizes greater than 100 nm, the lateral grain growth rather than the vertical grain growth is the limiting step in the crystallization process.

A new method for obtaining high quality polysilicon films on insulating substrates is now proposed. In this method, crystallization occurs by epitaxial growth from an adjacent polycrystalline film. In this manner growth is limited only by the vertical (solid-phase) crystallization rate, rather than the grain-nucleation rate and the lateral grain-growth rate. Significant improvements in process throughput and reductions in annealing temperature are achievable for the crystallization process. These improvements mitigate the glass-substrate warpage and shrinkage problems with the older processes due to either long annealing times or high annealing temperatures.

Accordingly, it is the primary aim of the invention to provide a method of crystallization of polysilicon films which require lower temperatures and shorter times than traditional annealing processes.

Further advantages of the invention will become apparent as the following description proceeds.

SUMMARY OF THE INVENTION

Briefly stated and in accordance with the present invention, there is provided a new method of crystallization, using polycrystalline silicon-germanium (poly-$Si_{1-x}Ge_x$ where x is some number greater than zero but less than or equal to 1) capping films to "seed"crystallization of $\alpha$-Si films. Once the capping film is in place crystallization occurs at lower temperatures and requires less time than in traditional methods. After crystallization has occurred the polycrystalline silicon-germanium (poly-$Si_{1-x}Ge_x$) capping film can be easily and selectively removed.

Numeric List of the Elements 10 wafer
12 $SiO_2$
14 silicon
16 capping seed layer
18 grain boundaries
20 nucleation sites
22 grain boundaries

BRIEF DESCRIPTION OF THE DRAWINGS

FIG. 3 shows the substrate of FIG. 2 after the processing step of crystallization annealing.

FIG. 4 shows the substrate of FIG. 3 after removal of the polycrystalline seed film.

while the present invention will be described in connection with a preferred embodiment, it will be understood that it is not intended to limit the invention to that embodiment or procedure. On the contrary, it is intended to cover all alternatives, modifications and equivalents as may be included within the spirit and scope of the invention as defined by the appended claims.

DETAILED DESCRIPTION OF THE INVENTION

An initial study to demonstrate the feasibility and the advantages of this new method, using polycrystalline silicon-germanium (poly-$Si_{1-x}Ge_x$) capping films to "seed" crystallization of $\alpha$-Si films was performed. Physical phenomena such as crystallization occur at lower temperatures for $Si_{1-x}Ge_x$ than for Si, therefore, $Si_{1-x}Ge_x$ is deposited in polycrystalline form at temperatures typically used for $\alpha$-Si deposition and crystallization, approximately 550° C. but within the range of 250° C. to 600° C.

Figure 1:
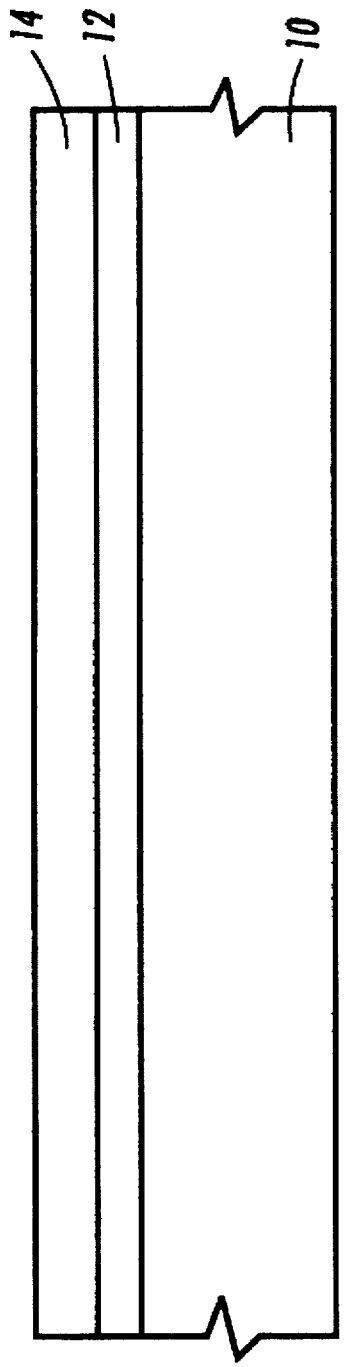
FIG. 1 shows a cross-sectional view of a substrate after deposition of an amorphous silicon film.
Figure 2:
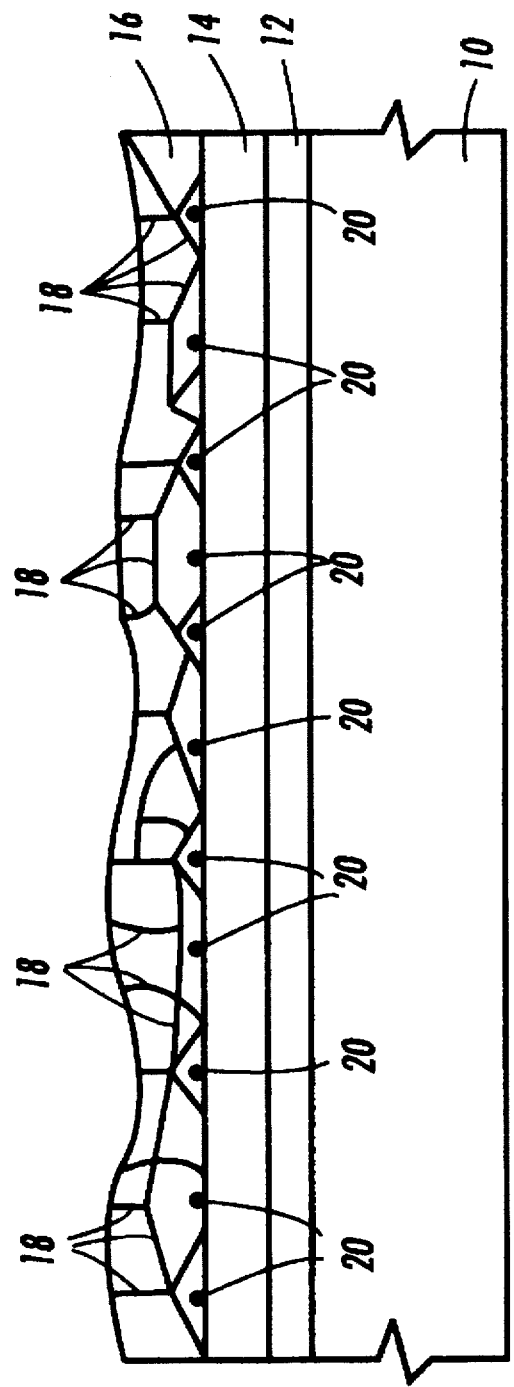
FIG. 2 shows the substrate of FIG. 1 after deposition of a polycrystalline seed film.

Two sets of wafers 10 (each consisting of 5 quartz wafers and 6 silicon wafers) were prepared as shown in FIG. 1 and a set of wafers 10 used to establish an experimental control case. In the control set, the $\alpha$-Si 14 was not capped. All three sets of the wafers 10 were first coated with $SiO_2$ 12, as an insulating layer, and annealed. The $SiO_2$ 12 was approximately 700 nm thick but thicknesses ranging from 0 nm (for quartz or glass substrates) to 1000 nm can be used. Afterwards, $\alpha$-Si 14 and a capping seed layer 16, were deposited in a conventional low-pressure chemical-vapor deposition (LPCVD) system as shown in FIG. 2. The $\alpha$-Si 14 deposition conditions used for each set of wafers 10 were identical. Temperature was kept at approximately 550° C. with deposition times of approximately 1 hour at a pressure of approximately 100 millitorr. These conditions were found to yield an approximately 86 nm-thick $\alpha$-Si 14 film.

For the first set of experimental wafers 10, the Ge source gas ($GeH_4$) was turned on for approximately 5 minutes immediately following the $\alpha$-Si 14 deposition step with the Si source gas (SiH$_4$), to deposit a capping layer of poly-Si$_{0.4}$Ge$_{0.6}$ as a capping seed layer 16. For the second set of experimental wafers 10, the Si source gas (SiH$_4$) was turned off immediately after the $\alpha$-Si 14 deposition step, and the Ge source gas (GeH$_4$) was turned on for 5 minutes, to deposit a capping seed layer 16 of polycrystalline germanium (poly-Ge).

It should be noted that, for a given deposition temperature, the deposition rate of Si$_{1-x}$Ge$_x$ is significantly higher than that of silicon and increases with the increasing amount of germanium present. Therefore, a capping layer of poly-Si$_{1-x}$Ge$_x$ can be deposited in a very short amount of time. The thickness of a capping seed film 16 of poly-Si$_{0.4}$Ge$_{0.6}$ poly-Ge films in this study are greater than 100 nm. Preferably, the thickness of the capping seed film 16 should be within the range of 5 nm to 500 nm thick.

Grain boundaries 18 and nucleation sites 20 can be seen in the capping seed layer 16. The arrangement of the grain boundaries 18 and the nucleation sites 20 is typical of deposited crystalline structure or a crystalline structure produced with a traditional annealing technique. Notice that near the boundary between the $\alpha$-Si 14 and the capping seed layer 16, the grain boundaries 18 appear random indicating that crystallization started in this region of the capping seed layer 14 with many nucleation sites 20. As the capping seed layer 16 grew upward from the $\alpha$-Si 14 the grain boundaries 18 become more orderly and there are no more nucleation sites 20. Analysis of a crystal for nucleation sites 20 and grain boundaries 18 can therefore identify where in the crystalline structure crystal growth began and in what direction the crystal grew.

While these experiments were done by depositing a capping seed layer 16 of either poly-Si$_{0.4}$Ge$_{0.6}$ or polycrystalline germanium, other alternatives are available for use as a capping Seed layer 16. The capping seed layer 16 could be deposited in an amorphous rather than a crystalline form. Because germanium and silicon germanium compounds anneal and crystallize at much lower temperatures than the silicon, it is possible to deposit the capping seed layer 16 in an amorphous state with crystallization of the capping seed layer 16 occurring first as part of the annealing and crystallization process step. Once the capping seed layer 16 has then crystallized the $\alpha$-Si 14 will also crystallize in the same manner as in these experiments.

Another variation in the capping seed layer is to deposit a layer, either amorphous or crystalline, of Si$_{1-x}$Ge$_x$ that has a graded concentration of germanium throughout the capping seed layer 16. This would be done to improve lattice mismatch between silicon and the capping layer. The lattic mismatch between silicon and germanium is about 4%. To promote efficient epitaxial growth, lattice mismatch should be kept below approximately 2%. Therefore, the germanium content in a graded capping seed layer 16 should be at its lowest at the interface between the $\alpha$-Si 14 and the capping seed layer 16 to promote epitaxial growth of a high quality silicon film. The germanium content elsewhere in the capping seed layer 16 can be greater to promote rapid crystallization at lower annealing temperatures.

Crystallization experiments were first carried out in a very rapid thermal processing (VRTP) xenon arc-lamp system along with a pre-heating step, in order to approximately determine the magnitude of the reduction in crystallization temperature achievable with the new method. The capping seed layer 16 of poly-Si$_{1-x}$Ge$_x$ was found to absorb the arc-lamp power more efficiently than $\alpha$-Si 14, so that a lower pre-heat temperature and/or lower lamp power could be used. The more efficient absorption of lamp energy by Si$_{1-x}$Ge$_x$ allows the capping seed layer 16 to heat up faster as well as to promote epitaxial growth. For example, a pre-heat temperature of 445° C. and lamp power of 14 kW was required in order to heat the uncapped $\alpha$-Si 12 samples to 650° C., compared to the 353° C. and 11 kw required for $\alpha$-Si 12 samples with a capping seed layer 16 polycrystalline germanium. Thus, for a VRTP crystallization process, an additional benefit of the poly-Si$_{1-x}$Ge$_x$ capping seed layer 16 is reduced power consumption.

The quartz wafers 10, from all three sets of samples, then underwent very rapid (2-second) thermal annealing as shown in FIG. 3. For the control set of samples, the annealing temperatures ranged from 647° C. to 660° C.; for the first set of experimental samples, they ranged from 625° C. to 650° C.; and for the second set of experimental samples, they ranged from 570° C. to 654° C.

These overlapping temperature ranges were chosen to allow comparisons of capped Si films with uncapped Si films that were annealed at the same temperature. The uncapped $\alpha$-Si films required an anneal temperature of greater than 645° C. for crystallization. The $\alpha$-Si 14 with a capping seed layer 16 of Si$_{0.4}$Ge$_{0.6}$ required approximately 620° C. for crystallization. Crystallization is evidenced by a change in the color and the transparency of the $\alpha$-Si 14 film. The $\alpha$-Si 14 films with a capping seed layer 16 of poly-Ge were found to crystallize at 570° C. These results verify that the crystallization temperature can be lowered by using a polycrystalline capping seed layer 16. Because the strain point of commercially available large-area glass substrates is approximately 630° C., this method allows a high-throughput, glass-compatible crystallization process to be realized.

The relationship between crystallization time and crystallization temperature is expected to vary for the capping layer crystallization process as it does for conventional processes. In the conventional process there is roughly an inverse logarithmic relationship between crystallization time and crystallization temperature. For instance, reducing the temperature by 100 degrees C. multiplies the time needed for crystallization by approximately 10. This is not an exact calculation but merely an approximation. It is expected that this approximate relationship between crystallization time and crystallization temperature will also apply to the new crystallization process described herein.

For instance, the experiments carried out have shown that $\alpha$-Si 14 films with a capping seed layer 16 of poly-Ge were found to crystallize at 570° C. with a 2 second annealing process, therefore, applying the time/temperature relationship from the conventional process, $\alpha$-Si 14 films with a capping seed layer 16 of poly-Ge should also crystallize at 470° C. in a 20 second annealing process. Alternatively, the time for crystallization should be reduced to one tenth of 2 seconds in a 670° C. annealing process.

Similarly, if $\alpha$-Si 14 with a capping seed layer 16 of Si$_{0.4}$Ge$_{0.6}$ required approximately 620° C. for crystallization in a 2 second process then a process at 520° C. and 20 seconds should also be sufficient for crystallization. Alternatively, the time for crystallization should be reduced to one tenth of 2 seconds in a 720° C. annealing process.

After the samples were crystallized as shown in FIG. 3, the poly-Si$_{0.4}$Ge$_{0.6}$ or poly-Ge capping seed layers 16 were etched away on two wafers, one each taken from the two experimental samples, in a standard "511" bath (a H$_2$O:H$_2$O$_2$:NH$_4$OH, 5:1:1 bath which is used in the standard "RCA" wafer-cleaning process) as shown in FIG. 4. An etch time of only a few minutes was found to be sufficient for complete removal of the capping seed layer 16. The thickness of the polysilicon film 14 that had a capping seed layer 16 of poly-$Si_{0.4}Ge_{0.6}$ was measured to be approximately 80 nm, while that of the polysilicon film 14 that had a capping seed layer 16 of polygermanium was measured to be 84 nm. These results verify that minimal germanium diffusion occurs during the crystallization process, and that poly-$Si_{1-x}Ge_x$ can be selectively removed by a simple wet-etch process. Germanium diffusion is manifested in a reduction in the remaining polysilicon 14 thickness, because any intermediate layer of $Si_{1-x}Ge_x$ which resulted from Ge diffusion is etched away in the "511" bath.

One wafer annealed at 645° C. was taken from each set of samples for X-ray diffraction (XRD) analysis. Peaks were observed in the XRD spectra for each of the Si films. The peak intensities were relatively weak, however, due to the thinness of the films. Both the control sample and the sample that had a capping seed layer 16 of poly-Ge exhibited only one peak corresponding to the {111} plane spacing in Si. In contrast, the sample that had been capped with poly-$Si_{0.4}Ge_{0.6}$ exhibited two peaks, corresponding to the {111} and {220} plane spacings in Si.

Another wafer, taken from the first experimental sample, which was annealed at 650° C., and which did not have the capping layer of poly-$Si_{0.4}Ge_{0.6}$ removed, was taken for additional XRD analysis. This sample exhibited four peaks, corresponding to the {111} and {220} plane spacings in the underlying Si film and in the capping $Si_{0.4}G_{0.6}$ film.

A wafer, taken from the second set of experimental samples, which was annealed at 646° C., and which did not have the capping seed layer 16 of poly-Ge removed, was taken for additional XRD analysis. This sample exhibited two peaks, corresponding to the {111} plane spacings in the underlying Si film and in the capping Ge film.

These results demonstrate that the texture or preferred orientation of the capping seed film 16 is replicated in the underlying silicon film 14 or that the crystallization of the silicon film 14 occurs epitaxially from the capping seed layer 16.

It should also be noted that the grain boundaries 18 and nucleation sites 20 in the capping seed layer 16 were replicated as grain boundaries 22 in the crystallized silicon 24 with crystallization starting at the boundary of the α-Si 14 and the capping seed layer 16 and crystal growth proceeding in a direction away from the boundary. This is distinctly different from crystallization of the α-Si 14 if it had occurred in a traditional annealing and crystallization process. In a traditional process, there would be nucleation sites near the interface between the $SiO_2$ 12 and the α-Si 14 with crystal growth occurring away from the $SiO_2$ 12 and α-Si 14 boundary. The distinctive pattern including absence of nucleation sites near the α-Si 14 and capping seed layer 16 boundary shows that crystallization of the α-Si 14 occurs epitaxially from the capping seed layer 16.

The sample that had a capping seed film 16 of poly-$Si_{0.4}Ge_{0.6}$ was analyzed by atomic-force microscopy (AFM), in a scanning-probe microscope. The root-mean-square (rms) surface roughness was measured to be 16 Å, and average grain size was estimated to be 150 nm. In comparison the rms roughness of conventional (uncapped) furnace-crystallized Si films is 20 Å or higher, and the average grain size in VRTP crystallized Si films is typically less than 50 nm. These results show that the epitaxial-crystallization method can provide polysilicon films 14 with relatively smooth surfaces and reasonably sized grains which are critical for achieving high-performance in top-gated thin film transistors (TFTs). Smooth surfaces and large grain sizes are important because roughness degrades effective carrier mobilities and enhances degradation due to electrical stress. It is anticipated that the performance of top-gated thin film transistors made in thin film silicon produced by the capping and crystallizing process disclosed in this application will be superior to the performance of top-gated thin film transistors made in thin film silicon produced in conventional processes due to the the superior characteristics of the thin film silicon, included reduced surface roughness and larger grain sizes.

The experiments have shown advantages to be gained by the disclosed process without adding much additional process complexity or time. Implementation of the EC method using poly-$Si_{1-x}Ge_x$ as a capping seed layer 16 introduces minimal additional process complexity and time because the capping seed layer 16 of $Si_{1-x}Ge_x$ is deposited in-situ immediately after the α-Si 14. Once the poly-Si 14 has been crystallized in the annealing step, as shown in FIG. 3, the capping seed layer 16 is easily removed in a readily available wet-cleaning bath. Removal of the capping seed layer 16 is important because it leaves a clean layer of thin film polysilicon for use in fabricating thin film transistors. Impurities or other layers in the thin film polysilicon will degrade performance of the thin film transistors produced within the thin film polysilicon layer.

First the "thermal budget" required for crystallization of an α-Si 14 film can be considerably lowered by using a capping seed layer 16 of a polycrystalline $Si_{1-x}Ge_x$ film and using an epitaxial crystallization (EC) method. Lowering the "thermal budget" helps to achieve compatibility with glass substrates and to improve process throughput.

Second, the EC process produces poly-Si 14 films with low surface roughness and reasonable grain sizes.

Third, the thickness and structural uniformities of polysilicon films obtained with the EC method are good because the capping film is deposited in-situ and the crystallization anneal is performed either in a conventional furnace or RTP system. In the EC process, crystallization occurs by epitaxial growth rather than by semi-random grain nucleation and subsequent grain growth. The EC method therefore provides a means to control and optimize polysilicon 14 texture. With a poly-$Si_{1-x}Ge_x$ capping seed layer 16, the preferred grain orientation in the capping seed layer 16 and in the underlying silicon film 14 can be adjusted by changing its germanium content.

We claim:

1. A thin film polycrystalline silicon layer on a substrate comprising:

a) a substrate with an upper and lower surface, and b) a layer of polycrystalline silicon with an upper surface, on the upper surface of the substrate, having no nucleation sites and a greater number of grain boundaries at the polycrystalline silicon upper surface than at the polycrystalline silicon and substrate upper surface interface indicating that crystallization and crystal growth occurred from the polycrystalline silicon upper surface and proceeded in a direction towards the substrate upper surface.

2. The thin film polycrystalline silicon layer on a substrate of claim 1 wherein the substrate comprises quartz.

3. The thin film polycrystalline silicon layer on a substrate of claim 1 wherein the substrate comprises glass.

4. The thin film polycrystalline silicon layer on a substrate of claim 1 wherein the substrate comprises silicon with an insulating layer at the upper surface in contact with the lower surface of the polycrystalline silicon.

5. The thin film polycrystalline silicon layer on a substrate of claim 4 wherein the insulating material comprises $SiO_2$.

* * * * *